United States Patent
Morris

[11] Patent Number: 5,859,581
[45] Date of Patent: Jan. 12, 1999

[54] THICK FILM RESISTOR ASSEMBLY FOR FAN CONTROLLER

[75] Inventor: Thomas M. Morris, Corpus Christi, Tex.

[73] Assignee: International Resistive Company, Inc., Corpus Christi, Tex.

[21] Appl. No.: 879,270

[22] Filed: Jun. 20, 1997

[51] Int. Cl.$^6$ .................................................. H01C 13/00
[52] U.S. Cl. .................................................................. 338/50
[58] Field of Search ................................... 338/308, 295, 338/221, 50, 309, 327, 53, 58, 320

[56] References Cited

U.S. PATENT DOCUMENTS

| | | | |
|---|---|---|---|
| 2,179,566 | 11/1939 | Stoekle | 338/50 |
| 3,626,352 | 12/1971 | McCoig | 338/190 |
| 3,895,272 | 7/1975 | Smolko | 317/256 |
| 4,070,517 | 1/1978 | Kazmierowicz | 428/209 |
| 4,119,937 | 10/1978 | Melvin et al. | 338/308 |
| 4,138,656 | 2/1979 | Resnicog | 338/322 |
| 4,168,344 | 9/1979 | Shapiro | 428/427 |
| 4,191,938 | 3/1980 | Gow | 338/195 |
| 4,278,725 | 7/1981 | Riley | 428/208 |
| 4,322,477 | 3/1982 | Wahlers | 428/432 |
| 4,404,237 | 9/1983 | Eichelberger | 427/96 |
| 4,935,717 | 6/1990 | Osawa | 338/51 |
| 5,000,662 | 3/1991 | Yamamoto | 417/32 |
| 5,035,836 | 7/1991 | Gardos | 252/511 |
| 5,038,132 | 8/1991 | Lindblom | 338/307 |
| 5,119,063 | 6/1992 | Nonnenmacher | 338/159 |
| 5,181,313 | 1/1993 | Nonnenmacher | 29/620 |
| 5,192,937 | 3/1993 | Lee | 337/104 |
| 5,192,940 | 3/1993 | Yajima | 338/308 |
| 5,274,351 | 12/1993 | Lee | 338/221 |
| 5,291,174 | 3/1994 | Zirnheld | 338/24 |
| 5,385,785 | 1/1995 | Lovell et al. | 428/408 |
| 5,408,575 | 4/1995 | Morris | 338/830 |

OTHER PUBLICATIONS

Electro–Science Laboratories, Inc.—Conductive Adhesives and Coatings.
Tool and Manufacturing Engineers Handbook, Soc. of Mech. Engineers, 3rd Ed, pp. 25–44 to 25–55, 1976.
Electro–Science Laboratories, Inc.—Copper Cermet Conductive Coating #2320.
Metech–Ronal. Ltd. Silver Conductor 2700.
Nippon Electric Glas Co., Ltd.—Ref. No. 9210–11E, Ref. No. 9210–12E and Ref. No. 9210–13E —.

Primary Examiner—Mark H. Paschall
Assistant Examiner—Jeffrey Pwu
Attorney, Agent, or Firm—G. Turner Moller, Jr.

[57] ABSTRACT

A power resistor assembly includes an anodizable metal substrate, preferably an aluminum alloy, having an insulating anodized coating on at least one flat side. A resistive or partially conductive ink is screen printed on the anodized coating in a pattern to provide one or more resistors. The ink has a curing temperature below 660° C. which is below the melting point of aluminum. The resistor assembly is a vehicular fan motor controller or an interior dimmer switch. The fan motor controller has resistor ends which are soldered with tin-lead solder.

10 Claims, 3 Drawing Sheets

THICK FILM RESISTOR ASSEMBLY FOR FAN CONTROLLER

BACKGROUND OF THE INVENTION

This invention will be described in two embodiments, a vehicular fan controller and a vehicular interior light dimmer switch.

Presently used vehicular fan controllers are mounted in the output air duct of the fan and incorporate several resistors of different value. The speed of the d.c. fan motor is controlled by placing one or more of the resistors in circuit with the fan motor. Because of the large numbers made each year and the potential for cost savings, a great deal of development has gone into vehicular fan controllers. Until recently, the standard fan motor controller used wound wire resistors which are relatively expensive and which tend to collect debris, such as lint or leaves, circulating in the air duct. Because the wound wire resistors get rather hot, there is a statistically significant fire hazard.

State of the art fan motor controllers incorporate thick film resistors printed on a non-conductive substrate and fall into two categories: those where the substrate is a porcelain coated steel substrate and those where the substrate is wholly ceramic. Typical fan motor controllers are found in U.S. Pat. Nos. 5,000,662; 5,192,940; 5,274,351; 5,291,174 and 5,408,575. Quite a few millions of thick film vehicular fan controllers are made annually.

Thick film resistor assemblies, although superior in many ways to wound wire resistance controllers, have their own set of difficulties. The motor controllers having porcelain coated steel substrates tend to be more expensive but dissipate heat better than the motor controllers having wholly ceramic substrates which are less expensive but which have more difficulty dissipating heat. The porcelain coatings are typically applied to the metal by firing a glass frit on the metal substrate at very high temperatures, e.g. approaching 850° C.

Another application of this invention is in dimmer switches used in the interior of vehicles. For some time, a major automotive manufacturer has been making an interior dimmer switch comprising a plastic housing having a series of conductive elements ending in plug in terminals, a rotatable dimmer controller having several conductive arms continuously in contact with the conductive elements in the housing, an aluminum heat sink having a flat side and a finned side, and a planar ceramic substrate providing a series of fixed resistors. One side of the ceramic substrate abuts the heat sink and the other side provides the resistors which are in circuit with the dimmer controller arms. A thermally conductive paste provide good thermal contact between the ceramic substrate and the flat side of the heat sink. The heat generated by current passing through the resistors transfers to the heat sink and is dissipated through the finned side. Quite a few millions of dimmer controllers of this type are made each year.

Because of the large numbers made each year and the potential cost savings, a great deal of development and refinement has gone into dimmer controls of this type. Examples are found in U.S. Pat. Nos. 4,935,717; 5,119,063 and 5,181,313.

Also of interest relative to this invention are the disclosures in U.S. Pat. Nos. 2,179,566; 3,895,272; 4,119,937; 4,138,656; 4,404,237; 4,912,306; 5,035,836; 5,038,132; 5,119,063 and 5,181,313.

SUMMARY OF THE INVENTION

In this invention, the substrate is an anodized metal. The metal may be of any anodizable type such as aluminum, magnesium and alloys thereof. For most applications, aluminum alloys are the preferred material. The substrate is anodized in a conventional manner to produce a thin, tough insulating coating bonded directly to the underlying metal. In the dimmer switch application, the substrate is a heat sink, having a flat side on which the resistors are applied and a finned side. Anodized aluminum substrates have three powerful advantages: low cost, structural strength and high heat dissipating capacity.

For thick film resistors to be competitive as interior dimmer switches, fan motor controllers or other high volume applications, the resistance elements must be applied in a high volume, inexpensive process. At the present state of the art, this means by screen printing. Unfortunately, there are no available resistive inks that meet the necessary requirements, which are (1) the ink must be capable of being screen printed, (2) the ink must be cured or fired at temperatures below the melting point of the aluminum substrate which is near 660° C., (3) one must be able to make a sturdy, reliable, inexpensive terminal to connect the resistor to external circuitry which, in the present state of the art, means soldering with conventional tin based solders, (4) the resistance values provided by the ink must be in a range that allows the resistors to have the desired values using a reasonable amount of ink and (5) the ink must bond or adhere to the substrate. Applicant has access to many hundreds of inks, both proprietary and available from suppliers. None meets all of these requirements.

A screen printable ink is a mixture of three major components—a powdered conductor or partial conductor, a powdered binder and a liquid carrier or dispersant. The powdered conductor or partial conductor is usually a metal or carbon. Carbon based resistors usually have very high resistive values which means a considerable amount of ink must be used to provide the lower values needed in vehicular fan controller resistors. Thus, a metal is the preferred conductor. In this invention, the binder is usually a glass or polymer and, in the end product, bonds to the substrate and encapsulates the powdered conductor. The liquid carrier or dispersant is usually an organic material which makes the mixture of a desired consistency or viscosity so the mixture can be applied by conventional screen printing equipment. After the ink is applied to the substrate, the substrate is placed in an oven in a nitrogen atmosphere and heated until the temperature rises to a desired firing temperature. As the temperature rises above 250° C. or so, the organic materials boil off leaving the binder and the conductor. A glass frit binder melts, or partially melts, bonding to the substrate and encapsulating the powdered conductor. A powder polymer binder polymerizes in an analogous manner into a solid mass, bonding to the substrate and encapsulating the powdered conductor.

A preferred ink is a cermet, i.e. a glass-metallic mixture, and comprises a low melting point glass frit, a powdered metal and an organic carrier. The glass frit has the property of melting substantially below 660° C. Copper is the preferred metal because it is inexpensive, it is relatively resistant to electro-migration, the amount may be readily controlled to provide the desired resistive values and it can be soldered with conventional solders without leaching the conductor from the resistors. The organic carrier may be of any conventional type, such as pine oil or turpineol.

A usable material which does not meet all five of the above requirements is a commercially available silver filled thermosetting resin. This material is conventionally used as a conductive adhesive in circuit board manufacturing and has the disadvantage that it cannot be soldered with conventional tin-lead solders because the solder dissolves the silver from the resistor leaving a conductor starved region near the terminal. This causes the value of any given resistor to be unpredictable and creates a very high resistance region near the terminal. In this invention, this problem is preferably solved by plating or printing a copper or nickel pad on top of the terminal end and soldering to the pad. The problem can also be solved by soldering using a silver solder. This material is desirable for applications where no fixed terminal is required, such as the interior dimmer switch, because the polymer material is considerably more lubricious than presently used thick film materials which provides for moderately long life without conventional lubricants or extremely long life with conventional lubricants.

In the case of fan motor controllers, the high heat dissipating capacity of anodized metal substrates allows the resistances to be applied to only one side of the assembly. Compared to wholly ceramic substrates, this halves the machine time for the screen printing operation. The high heat dissipating capacity also allows the substrate to be smaller. This not only saves material cost, it also allows more resistor assemblies to be made from the largest size stock that is compatible with screen printing equipment. In the existing equipment of the assignee of this invention, four wholly ceramic assemblies or six anodized aluminum assemblies can be printed. Printing machine time is thus reduced another third, in addition to the half reduction from being able to print on only one side. There is also a one-third savings in oven time because more resistor assemblies can be put into the oven at the same time. In addition, the strength of aluminum substrates means the blanks which are printed and fired can be sheared to the desired size without the few percent loss rate experienced when scoring and breaking ceramic substrates. In fan controllers, the reduction in overall cost of this invention is in excess of 25% when compared to wholly ceramic assemblies which are less expensive than the currently available porcelain-steel assemblies. A cost reduction of this magnitude is surprising in an area as well developed as thick film resistors where 5% improvements are thought to be significant.

The cost reductions in interior dimmer switches are comparable. Although there is no improvement in machine time because the pieces are sized to fit existing designs and only one side needs to be printed, the ceramic substrate is eliminated because the resistors are printed directly on the aluminum heat sink. This not only eliminates the cost of the ceramic substrate, it also eliminates the assembly effort including the heat conductive paste, machine time, labor and parts rejection because of assembly errors. It is elegant to eliminate a component in an assembly and the cost advantages run substantially beyond the direct cost of the component.

It is an object of this invention to provide an improved resistor assembly.

Another object of this invention is to provide an improved resistor assembly incorporating an anodizable metal substrate having an anodized insulating coating and one or more thick film power resistors screen printed directly on the insulating coating.

A further object of this invention is to provide an improved dimmer switch assembly in which the resistive elements are screen printed to an anodized metal heat sink.

Another object of this invention is to provide an improved fan controller assembly in which a plurality of resistors are screen printed directly on an anodized metal substrate.

These and other objects of this invention will become more fully apparent as this description proceeds, reference being made to the accompanying drawings and appended claims.

DETAILED DESCRIPTION

Figure 1:
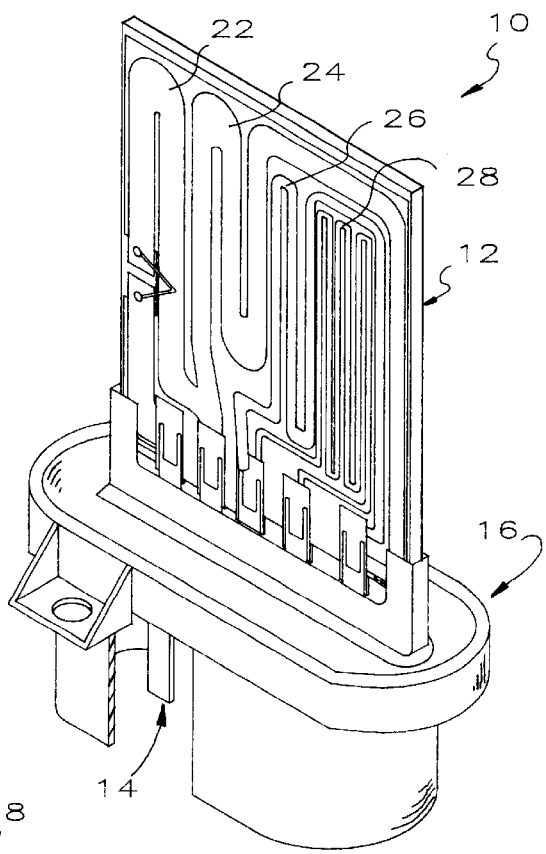
FIG. 1 is an isometric view of a fan motor controller assembly of this invention.
Figure 2:
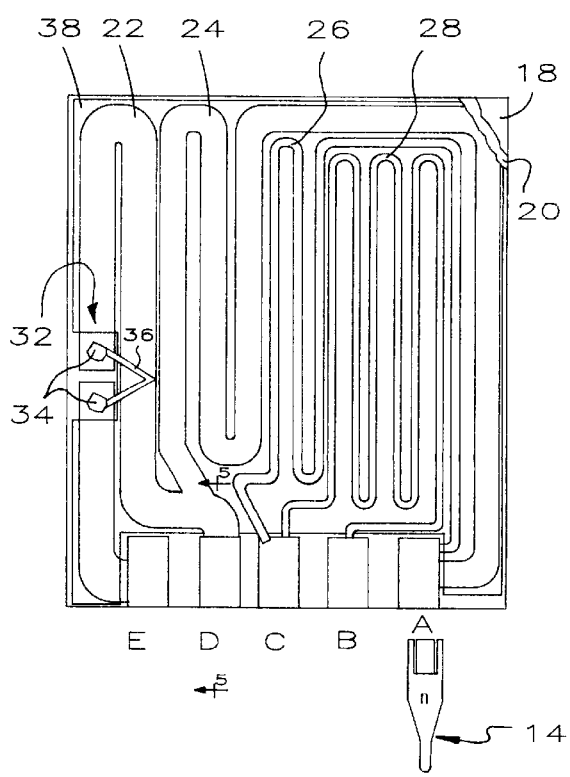
FIG. 2 is a plan view of the resistor of FIG. 1.

Referring to FIGS. 1–2, there is illustrated a resistor assembly 10 of this invention which may be used in a conventional vehicular fan assembly of the type shown in U.S. Pat. Nos. 5,000,662; 5,192,940; 5,274,351; 5,291,174 and 5,408,575, to which reference is made for a more complete description of one application of this invention.

The resistor assembly 10 comprises, as major components, a rectilinear substrate 12, a plurality of conductive terminals 14 and a plastic connector 16 such as shown in U.S. Pat. No. 5,408,575. The terminals 14 provide electrical connection to the fan motor (not shown) and selector switch (not shown) and the plastic connector 16 mechanically supports the assembly 10 in the air duct (not shown) of the vehicle in which the assembly acts as a fan motor controller.

The substrate 12 includes four straight sides and includes an anodizable metal base 18 having an anodized coating 20 bonded directly to the base 16. The metal base 18 is of a high heat conductivity material and is selected from the group consisting of aluminum, magnesium and alloys thereof. Because of its combination of high heat transmission capacity and low cost, aluminum alloys, such as 6061, 3003 and 5052, are the preferred material for most applications. Aluminum and magnesium have very similar melting points, i.e. 660° C. and 650° C. respectively. Most common alloys, especially the commercially available ones, have very similar melting points.

Although the substrate 12 may be of any desired thickness, it is much preferred that the substrate 12 be quite thin, preferably less than about 3 millimeters thick and optimally on the order of 1 millimeter thick.

An important feature of the substrate 12 is its heat transmission abilities. The ultimate cost of the assembly 10 is directly proportional to the size of the substrate 12. The minimum size that the assembly 10 can be made is partly a function of how many fan speeds the assembly must provide and the size of the connector 16. The substrate 12 has the thermal capacity to be printed on only one side. Printing on only one side has manufacturing efficiencies because only one set of printing-curing steps is needed.

The anodized coating 20 is a metal oxide coating created by conventional anodizing techniques. The coating 20 is of sufficient thickness to provide adequate dielectric strength to insulate the conductive metal base 18 from the resistor array. For use in automotive applications where the operating voltage is 12 volts d.c. and the maximum design voltage is 24 volts d.c., the anodized coating should have insulating qualities of at least about 400 volts/mil and be at least about 0.25 mil thick. Commercially available anodized coatings are thin, tough coatings that bond to the metal base 18 and provide a surface that can receive and bond to a printable material which makes up the resistor array. Anodizing is a well known commercial operation and is described in some detail in Tool and Manufacturing Engineers Handbook, Society of Manufacturing Engineers, 3rd Edition, 1976, pages 25–44 through 25–55, to which reference is made for a more complete description. With an aluminum substrate, the coating 20 is aluminum oxide which is an excellent electrical insulator and a tolerably good heat transmitter.

Figure 3:
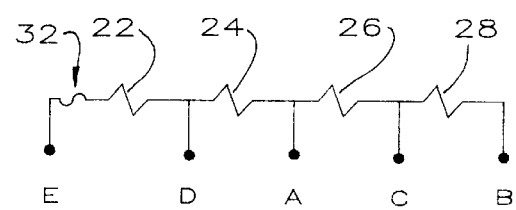
FIG. 3 is a schematic view of the electric circuit incorporating the fan motor controller of FIGS. 1 and 2.
Figure 4:
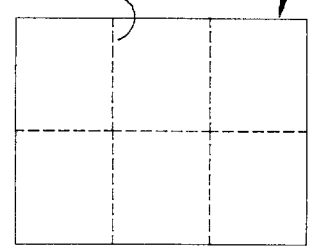
FIG. 4 is a plan view of an anodized metal blank used to make a series of resistors as suggested by the dashed lines.

The resistor array is created by applying a resistive or partially conductive ink to the anodized coating 20 by screen printing. Those skilled in the art can recognize a screen printed resistor from an inspection of the article by its appearance because the material is 0.5 to 2 mils thick and the geometries are consistent with screen printing, specifically, the width of the resistors are at least 5 mils and the width of the gaps between them are at least 5 mils. Vehicle fan motor controllers are typically made in three or four resistor patterns. As illustrated in FIGS. 1–3, the resistor array includes four thick film power resistors 22, 24, 26, 28 which end in pads A, B, C, D, E. As used herein, a power resistor has a capacity of at least three watts and is capable of reducing current flow and/or the applied voltage to the fan motor. Thick film resistors are on the order of one mil thick as compared to thin film resistors which are on the order of about 1000 Angstroms or 10,000 atomic units thick. The nominal values for the resistors 22, 24, 26, 28 may be about 0.1, 0.3, 0.8 and 1.6 ohms respectively. The resistance of the assembly 10 accordingly depends on which of the pads A, B, C, D, E are in circuit, as suggested in FIG. 3, and is thus dependent on the fan speed switch position, as is customary.

The resistors 22, 24, 26, 28 are screen printed onto the substrate 12 with a screen printable ink comprising a powdered conductor, a binder and a liquid carrier or dispersant. The powdered conductor is preferably a metal and optimally is copper because it is inexpensive, it is relatively resistant to electromigration, the amount may be readily controlled to provide the desired resistive values and it can be soldered with conventional solders without leaching the conductor from the resistors.

In this invention, the binder is usually a glass or polymer and, in the end product, bonds to the substrate and encapsulates the powdered conductor. Preferably, the binder is a low melting point glass frit melting substantially below 660° C. which is the melting point of aluminum. Typical low cost aluminum alloys are 95%+ aluminum and have melting points near, but slightly below 660° C. A typical low melting point glass is a low melting point lead borosilicate glass such as is available from Nippon Electric Glass Co., Ltd. of Osaka, Japan as Glass GA-9 or GA-21.

An important feature of the glass frit is that it must adhere well to the anodized substrate after firing. The adhesion for a successful thick film resistor of this invention is at least 0.25 kg/0.01 in$^2$ pad and is preferably above 1 kg/0.01 in$^2$ pad. This is not insignificant because ink candidates exist which look good on a data sheet but which do not adhere to anodized substrates. Adhesion is measured by soldering a 0.032" diameter wire to a 0.1"×0.1" conductor pad with the wire parallel to the substrate surface. The wire is then bent 90° and pulled while measuring the force required to destroy the joint.

The liquid carrier or dispersant may be any of a wide variety of materials and is used to provide the desired consistency or viscosity so the mixture can be applied by conventional screen printing equipment. After the ink is applied to the substrate, the substrate is placed in an oven in a nitrogen atmosphere and heated until the temperature rises to a desired firing temperature. As the temperature rises above 250° C. or so, the organic materials boil off leaving the binder and the conductor. The organic carrier may be of any conventional type, such as pine oil or turpineol.

In response to applicant's requirements, Metech, Inc. of Elverson, Pa. has developed a suitable composition known as PC# 10835. This material is a copper filled low melting point glass mixture dispersed by an organic carrier and having the following properties:

resistivity: 4 milliohms/square at 24 microns thickness
good solderability with tin-lead solders adhesion to anodized aluminum: 1–2 kg/0.01 in$^2$ pad
printing: 200 mesh stainless steel screen drying: 5–10 minutes at 120° in air
firing profile: rise rate=70° C./minute with 5 minutes at 605° C. peak
descent rate=70° C./minute, 5 minutes above 550° C.

In this invention, a 1 millimeter thick aluminum sheet 30 is anodized on all sides and edges. The resistor pattern shown in FIGS. 1–2 is then screen printed with Metech PC# 10835 using a 200 mesh stainless steel screen. The sheet 30 is fired in an oven in a nitrogen atmosphere in accordance with the above firing profile.

A suitable fuse 32 is provided. The fuse 32 may comprise a solder droplet 34 designed to soften or melt at a predetermined temperature and a bent solder wire strip 36. When the operating temperature of the resistor assembly 10 approaches the predetermined temperature, the solder droplet 34 softens or melts and the strap 36 falls off or melts thus interrupting the electric circuit and shutting off electricity to the fan motor.

A protective coating 38 is then applied to the substrate, as by screen printing or the like, covering the resistors 22, 24, 26, 28 and most of the anodized metal coating 20 and protecting them against abrasion, chemical degradation and the like. The coating 38 does not substantially impede heat flow from the surface of the resistor assembly 10. To these ends, the coating 38 may be of any suitable type, such as a UV curable, high temperature polymer available from W. R. Grace Chemical Co. and known as Type 3315.

Figure 5:
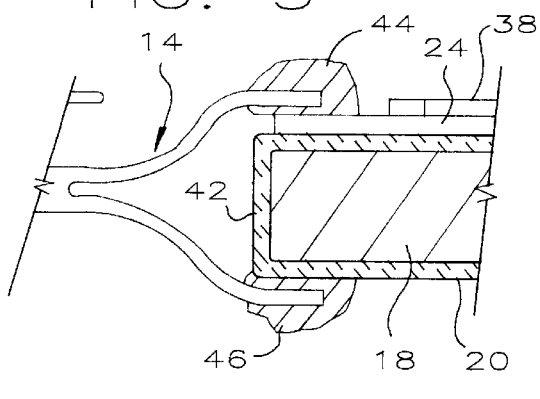
FIG. 5 is a cross-sectional view of the resistor of FIG. 1, taken substantially along line 2—2 thereof, as viewed in the direction indicated by the arrows.

The sheet 30 is sheared into a series of resistor assemblies shown by the dashed lines 40. Thus, each substrate 12 has at least one edge 42, shown in FIGS. 5 and 6, where the anodized coating wraps around the edge of the substrate. The resistor pattern is printed on the sheet 30 so the pads A, B, C, D, E are adjacent the edge 42. As shown in FIG. 5, the terminals 14 are soldered directly to the pads A, B, C, D, E with a conventional tin based solder 44 and are soldered to the anodized substrate 12 on the back by a tin based solder 46. Because of the insulated edge 42, there is no tendency for the terminal 14 to short against the metal base 18 of the substrate 12. The tin based solder may be of any suitable type, such as 63/37 solder which is 63% tin, 37% lead. This solder is a eutectic having a melting point at 182° C. Tin-lead solders are commonly used in the industry although other tin based solders are usable with this invention.

In the alternative, the material of the resistors 22, 24, 26, 28 may be a conductor filled thermosetting polymer resin. The resistance of such materials can be modified somewhat by adjusting the amount of conductive material, such as metal, incorporated in the polymer. The curing temperature of the selected material is quite low, such as in the range of 150°–350° C., well below the melting point of the anodizable metal substrate 12. The selected polymer may be of any suitable type such as epoxies, thermosetting epoxy/polyester hybrids, phenolics and the like.

The conductor filling of the conductor filled thermosetting polymer resin ink is an electrically conductive material that provides resistance values relative to its presence in the resin ink, i.e. the more conductor filling, the less the resistance of the cured polymer. Typically, the conductor is selected from such metals as silver, copper, nickel and alloys thereof. In addition, carbon can be used in higher resistance value polymer inks.

An ideal conductor filled thermosetting polymer resin ink is preferably solderable with conventional tin based solders, i.e. solder can be directly applied to and bond to the cured polymer. Polymer resin inks which are not easily solderable are also operative if steps are taken to improve their solderability. For example, a suitable but less than ideal conductor filled thermosetting resin is known as Conductive Adhesive and Coating Silver Composition 1110-S from Electro-Science Laboratories, Inc., King of Prussia, Pennsylvania and Silver Conductor 2700 from Metech-Ronal Ltd. High Peak Laboratories, Ashbourne Road, Buxton, Derbyshire, England. These materials are silver filled thermosetting resins and have slightly different cure cycles. Composition 1110-S has a cure cycle of 150° C. for 2–3 hours or 200° C. for 1–2 hours and is supposedly solderable with 62/36/2 Sn/Pb/Ag solder at 220° C. Silver Conductor 2700 has a cure cycle of 245° C. for 30 minutes. Even though these materials are designed for use as conductors, the amount of the metal filling can be adjusted to provide the desired resistance values or the shape of the resistors can be modified to provide thick, wide conductive sections and thin, narrow resistive sections. The problem with soldering these materials on an anodized substrate is the conventional solder dissolves a significant part of the silver adjacent the solder leaving an area of very high resistance and making the resistance value of the resistor unpredictable.

Figure 6:
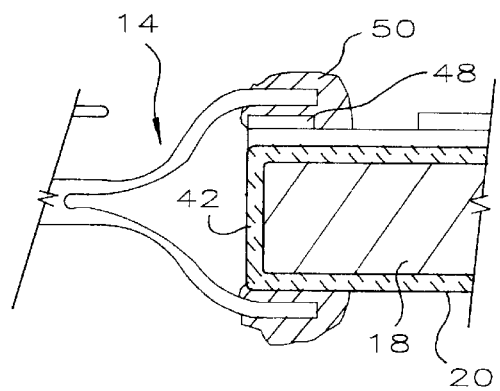
FIG. 6 is a cross-sectional view of another embodiment of this invention, and is similar to FIG. 5.
Figure 8:
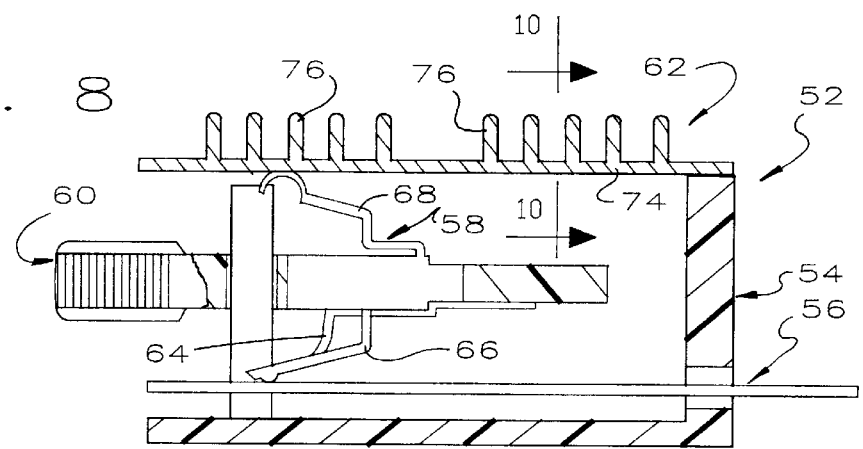
FIG. 8 is a cross-sectional view of the dimmer switch of FIG. 7.
Figure 10:
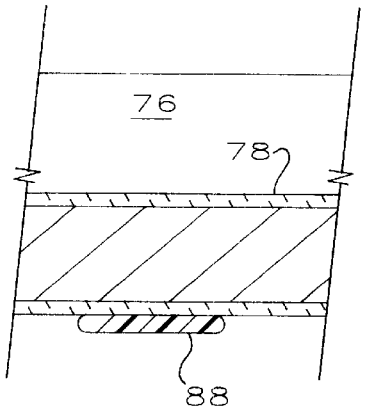
FIG. 10 is a cross-sectional view of the heat sink of FIGS. 6, 7 and 9, taken substantially along line 10—10 of FIG. 7, as viewed in the direction indicated by the arrows.

This problem can be solved in one of two ways. The best technical approach is shown in FIG. 6 where a patch 48 of copper or nickel is applied over the ends of the pads A, B, C, D, E. This application may be done by plating or by screen printing and then curing. Solder 50 may then be applied to the patch 48 without dissolving the silver in the resistors. In the alternative, silver solder may be used which does not dissolve silver in the resistor as rapidly as conventional tin-lead solders.

The terminals 14 may be attached to the resistor assemblies 10, either before or after they are separated. The blank is cut to separate the individual resistor assemblies 10. This is accomplished in any suitable manner, as with a metal shear. The anodized coating is surprisingly unaffected by the shearing operation with very little edge deformation or crazing noticed.

Referring to FIGS. 7–10, a dimmer switch 52 of conventional design includes a plastic housing 54, a terminal assembly 56, a movable conductive switch assembly 58, a movable thumb wheel 60 and a heat sink 62 of this invention. The switch assembly 58 includes a first set of conductive arms 64, 66 for engaging the terminal assembly 56 and a second set of conductive arms 68 which extend through openings 70 in the thumb wheel 60 for contact with a resistor array 72 on a flat side 74 of the heat sink 62. It will be seen that rotation of the thumb wheel 60 causes rotation of the switch assembly 58.

Figure 9:
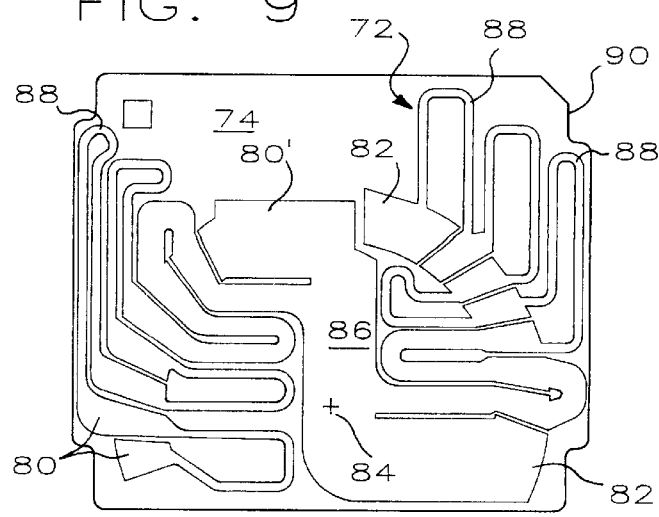
FIG. 9 is a bottom view of the heat sink shown in FIG. 7 and has the resistor pattern thereon.
Figure 7:
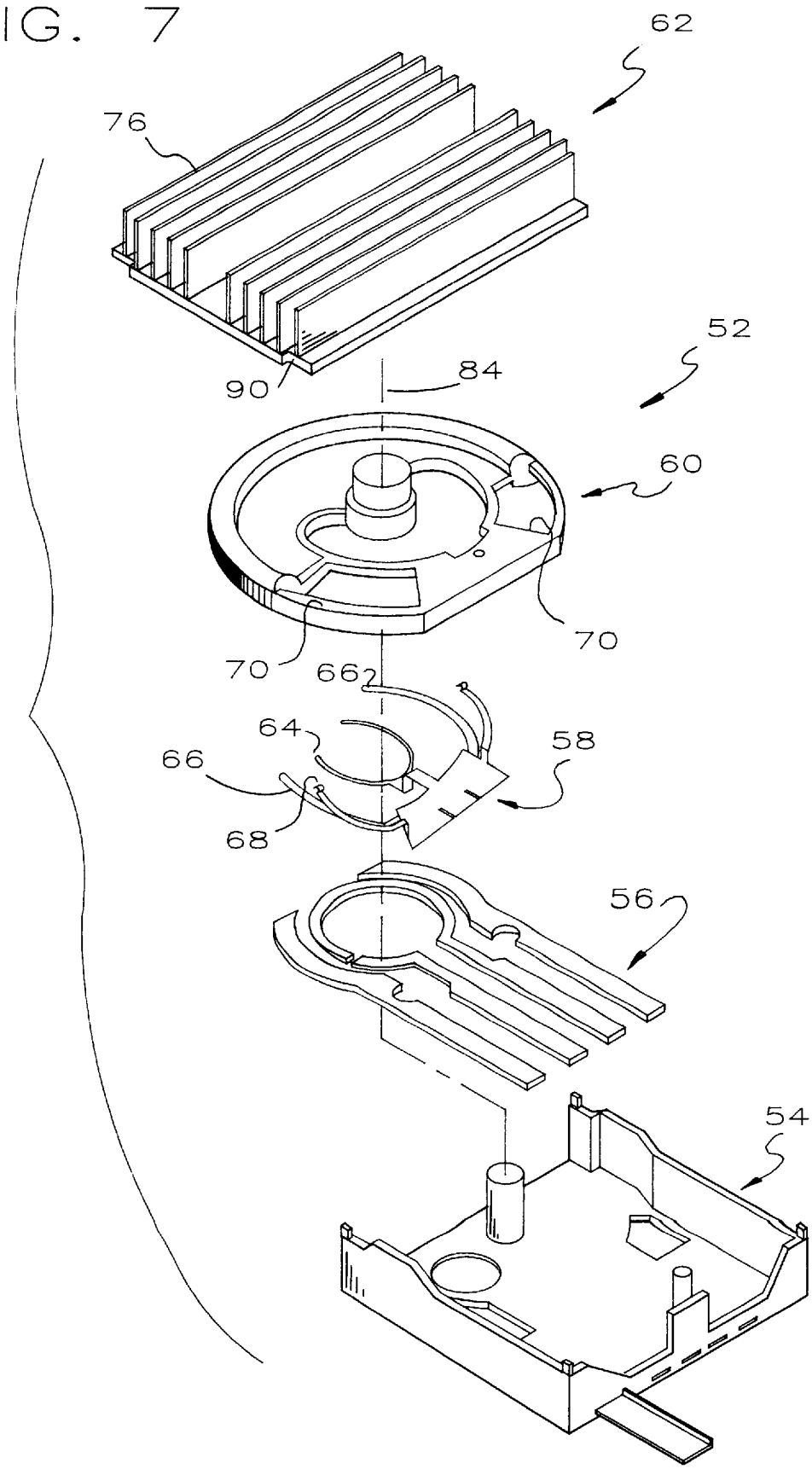
FIG. 7 is an exploded isometric view of an interior dimmer assembly of this invention.

The heat sink 62 is an anodizable metal structure having a plurality of heat transfer fins 76 extending away from the flat side 74. As in the embodiment of FIGS. 1–3, the heat sink 62 has been anodized to provide an insulating coating 78 of sufficient dielectric strength onto which the resistor array 72 is screen printed using either the cermet or the metal filled thermosetting resin material previously discussed directly onto the coating 78 in an appropriate pattern, such as shown in FIG. 9.

The resistor array 72 includes a series of thick film pads 80, 82 arranged in a circular arc about an axis 84 for engagement with the conductive arms 68 of the switch assembly 58, a central conductive path 86 connecting the end pads 80', 82' and a series of discrete thick film resistors 88 in circuit with selected ones of the pads 80, 82. It will be seen that when the switch arms 68 engage the pads 80', 82', essentially no resistance is in the circuit and there is no dimming of the lamps to which the switch 52 is connected. As the switch arms 68 rotate in response to rotation of the thumb wheel 60, selected ones of the thick film resistors 88 are placed in circuit and current flow through the switch 52 is selectively reduced. Those skilled in the art will recognize the resistor array 72 as operating in the same manner as resistor arrays in presently used dimmer switches. For a more complete description of dimmer switches of this type, reference is made to General Motors Part No. 1995318 and the publications relating thereto.

The material of the conductive sections 80, 82, 86 is the same as the material of the resistive section 88 and is applied at the same time directly to the insulating coating 78 by screen printing a conductive paste or ink thereon as discussed above. The conductive sections 80, 82, 86 are much more conductive because their length to width ratio is much smaller than the length to width ratio of the resistors 88, as will be recognized by those skilled in the art. Thus, if the resistance value of the ink is selected appropriately and the length and width of the conductive sections 80, 82, 86 and resistors 88 are judiciously selected, the same ink can be used for both the conductive and resistive portions of the resistor array 72 so both portions can be printed simultaneously.

It will be apparent that the heat sink 62 preferably starts as an extrusion which is cut transversely to separate the individual pieces. The extrusion can be anodized before cutting into individual segments where the resistor arrays 72 are printed onto a long length of the extrusion. In this event, the extrusion is cut to length and notches 90 are cut in the ends so the heat sink 62 fits in the housing 12 in a conventional manner. In the alternative, the extrusion can be cut laterally before anodizing.

In the embodiment of FIGS. 7–10, the heat sinks are an anodizable metal, such as aluminum, magnesium, and alloys thereof. Typically, the metals of the heat sink are, to some degree, alloys because of the preferred properties and inexpensive nature of alloys. For most commercial applications, aluminum alloys are the preferred material because of a combination of low cost, high heat capacity and transmissibility and strength.

In conventional dimmer switches, such as made by the assignee of this invention, a high temperature thick film ink is screen printed on a ceramic substrate which is thermally bonded to a heat sink by a thermally conductive paste. In this invention, the heat sink is anodized and the resistor array 72 printed directly on the anodized coating thereby eliminating the ceramic substrate, the thermally conductive paste and the necessary assembly effort.

The cermet and polymer materials of this invention have another important advantage in the dimmer switch of FIGS. 7–10. Conventional dimmer switches use a high temperature screen printed thick film resistor which is somewhat abrasive. Without lubrication, conventional switches fail at about 2500 cycles. With lubrication, conventional switches fail at about 12,000 cycles. Without lubrication, the polymer ink dimmer switches fail at about 10,000 cycles and, with lubrication, their life is unknown but substantially in excess of 15,000 cycles. With lubrication, the cermet ink switches fail at about 15,000 cycles. In any event, both are substantially more lubricious than conventional materials and provide longer lived dimmer switches.

Although this invention has been disclosed and described in its preferred forms with a certain degree of particularity, it is understood that the present disclosure of the preferred forms is only by way of example and that numerous changes in the details of construction and operation and in the combination and arrangement of parts may be resorted to without departing from the spirit and scope of the invention as hereinafter claimed.

I claim:

1. A fan motor controller comprising a resistor assembly having an anodizable metal substrate having a flat portion and an insulating anodized coating bonded directly to the flat portion;

at least two screen printed thick film power resistors of different resistance value bonded to the anodized coating with an adhesion of at least 0.25 kg/0.01 in$^2$ and having two ends and a capacity of at least three watts, the thick film power resistor comprising a metal and a fused borosilicate glass binder having a curing temperature below the melting point of the substrate and below 660° C.; and a conductive terminal and a solder bonding the terminal to the resistor ends.

2. The fan motor controller of claim 1 wherein the borosilicate glass is a lead borosilicate glass.

3. The fan motor of claim 1, wherein the metal is copper and the terminal is soldered directly to the resistor ends.

4. The fan motor controller of claim 1 wherein the substrate is of a regular polygonal shape having a plurality of edges including
      a first edge having the insulating coating wrapped from a top surface of the substrate, around the first edge and onto a bottom surface of the substrate,
      a plurality of second edges having the insulating coating on a top surface of the substrate and on the bottom surface of the substrate and a bare metal section exposed on the second edges, the resistor ends being adjacent the first edge, the terminal being connected with tin-lead solder to the terminal pad on one side of the substrate and bonded to the insulating coating on the opposite side of the substrate.

5. The assembly of claim 1 wherein the metal substrate is selected from the group consisting of aluminum, magnesium and alloys thereof.

6. The assembly of claim 5 wherein the metal substrate consists of aluminum and aluminum alloys and has a melting point in the range of 600°–660° C.

7. The assembly of claim 1 wherein the insulating anodized coating has a dielectric strength of at least about 400 volts/mil and has a thickness of at least 0.25 mils.

8. The assembly of claim 1 wherein the substrate is a flat sheet having a thickness less than about three millimeters.

9. The assembly of claim 8 wherein the thickness is about one millimeter.

10. A fan motor controller comprising a resistor assembly having an anodizable metal substrate comprising a flat sheet being no more than about three millimeters thick and having an insulating anodized coating bonded directly to the flat sheet;

at least one screen printed thick film power resistor bonded to the anodized coating with an adhesion of at least 0.5 kg/0.01 in$^2$ and having two ends and a capacity of at least three watts, the thick film power resistor comprising copper and a low melting point glass having a softening temperature substantially below 660° C. and below the melting point of the substrate; and a conductive terminal and a tin-lead solder bonding the terminal to the resistor ends.

* * * * *